US006867609B2

United States Patent
Holcombe et al.

(10) Patent No.: US 6,867,609 B2
(45) Date of Patent: Mar. 15, 2005

(54) PROBE FOR TESTING CIRCUITS, AND ASSOCIATED METHODS

(75) Inventors: Brent A. Holcombe, Colorado Springs, CO (US); David Daniel Eskeldson, Colorado Springs, CO (US); Bobby J. Self, Colorado Springs, CO (US); Emad Radwan Soubh, Camas, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 66 days.

(21) Appl. No.: 10/373,820

(22) Filed: Feb. 25, 2003

(65) Prior Publication Data

US 2004/0164754 A1 Aug. 26, 2004

(51) Int. Cl.[7] .............................................. G01R 31/02

(52) U.S. Cl. .................................... 324/754; 324/158.1

(58) Field of Search ............................... 324/754–762, 324/73.1, 158.1, 72.5; 439/482

(56) References Cited

U.S. PATENT DOCUMENTS

| 3,757,219 | A | * | 9/1973 | Aksu ........................... 324/758 |
| 4,161,692 | A | * | 7/1979 | Tarzwell ...................... 324/754 |
| 4,724,377 | A | * | 2/1988 | Maelzer et al. .............. 324/149 |
| 4,743,839 | A | * | 5/1988 | Rush ........................... 324/72.5 |
| 5,172,051 | A | * | 12/1992 | Zamborelli ................ 324/72.5 |

* cited by examiner

Primary Examiner—Vinh P. Nguyen (57) ABSTRACT

A connector-less probe is disclosed. The probe permits probing of a board or bus without the use of a mating connector. The probe has a support attached to the probing end of the probe. A spring pin and an isolation network are attached to the support. The support is arranged substantially perpendicular to a target board during probing of a test point on the target board. The spring pin engages the test point on the target board. The spring pin is arranged substantially perpendicular to the target board when the spring pin engages the test point on the target board, and the spring pin is securely attached to the support so that the spring pin is substantially parallel to the support. The isolation network is electrically coupled to the spring pin so that the spring pin is located between the isolation network and the test point during probing of the test point. The isolation network is also securely attached to the support.

33 Claims, 8 Drawing Sheets

PROBE FOR TESTING CIRCUITS, AND ASSOCIATED METHODS

FIELD OF INVENTION

The present invention relates generally to probes for electrical circuits and, more particularly, to high-speed digital-signal probes that do not require a mating connector, otherwise known as connector-less probes.

BACKGROUND

In order to evaluate or debug high-speed digital circuits, accurate measurement and display of signal waveforms and alternating current (AC) characteristics are often desired. In many instances the measurements are performed by specifically designed probes, which have predefined physical and electrical qualities.

The electrical qualities of a probe determine, in part, the probe's response to the AC characteristics, the accuracy of the measurement, and the extent to which the probe detects the signal without detrimentally affecting the operation of the system or circuit being probed. One measure of a probe's intrusiveness is the electrical and capacitative loading presented by the probe to the circuit. A probe tip having high capacitance may cause circuit-loading problems in circuits having signals with fast edge rise and fall times. Minimizing the capacitance associated with the probe has been one solution for reducing the electrical and capacitative loading presented by the probe.

Figure 1:
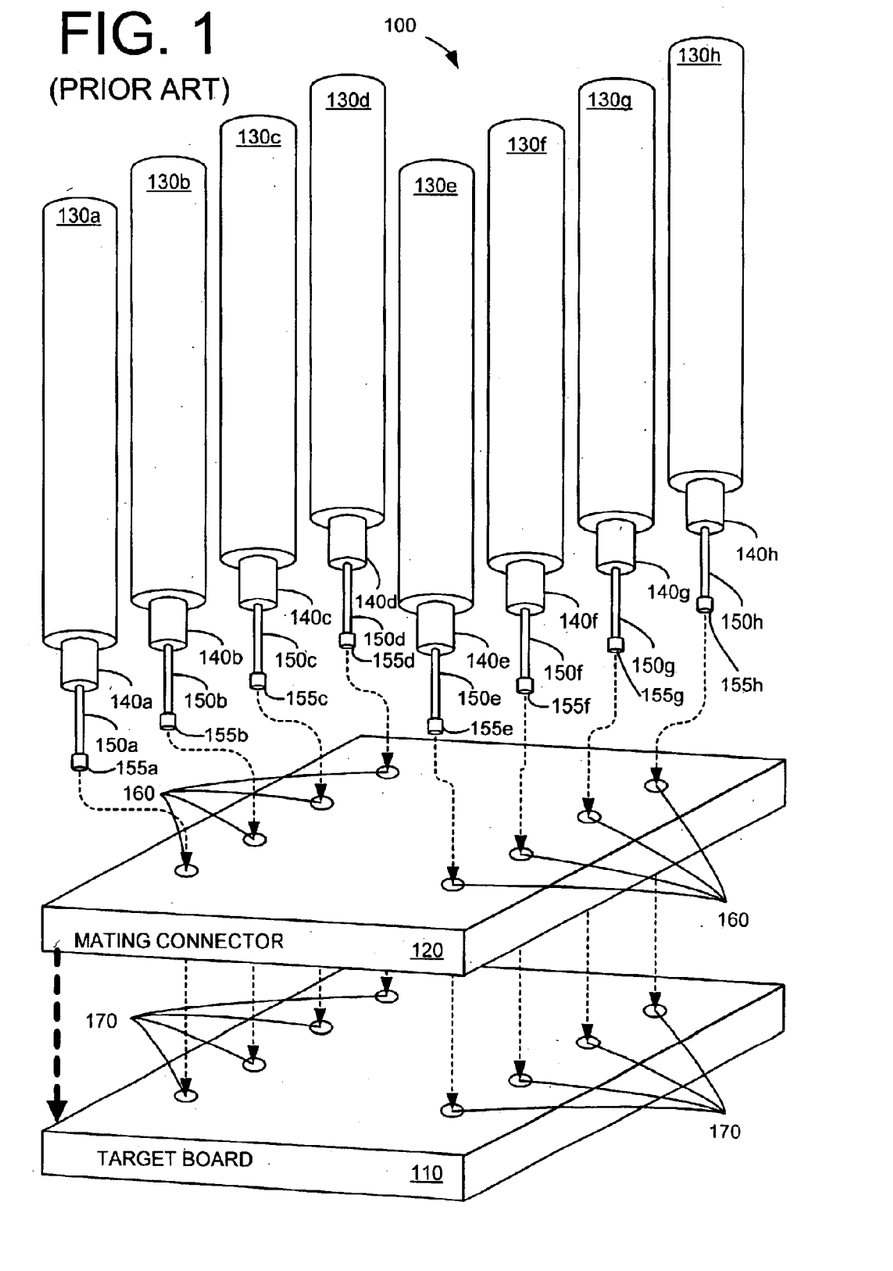
FIG. 1 is a schematic diagram showing a prior-art probe and a mating connector used for probing a target board.

As shown in FIG. 1, a conventional probe includes a probe tip bore 150a with a probe-tip connector 155a that inserts into a contact hole 160 of a mating connector 120 to measure signals at a specific test point on a target board 110. Usually, the hole 160 on the mating connector 120 guides the probe-tip connector 155a through the hole 160 to its corresponding test point.

If simultaneous measurements from multiple test points 170 are desired, then a multiple-tip probe 100 may be used to take test measurements from the multiple test points 170. One of the physical qualities of a probe is to reliably contact all of the desired test points 170. Unfortunately, it is often difficult to directly align each of the multiple probe-tip connectors 155a . . . 155h of the probe 100 to a corresponding test point 170. Thus, a specialized mating connector 120 is often used in conjunction with the probe 100 to help properly align the probe-tip connectors 155a . . . 155h with corresponding test points 170.

A mating connector 120 typically has multiple contact holes 160 arranged to form a specific footprint on one side of the mating connector 120. Each contact hole 160 on the footprint corresponds to the location of one of the multiple test points 170 on the target board 110. Thus, the mating connector 120 aligns each probe-tip connector 155a . . . 155h with a corresponding test point 170. Although not shown in FIG. 1, the mating connector 120 is secured to the target board 110 so that the contact holes 160 are aligned to the test points 170. Upon securing the mating connector 120 to the target board 110, the probe-tip connectors 155 are inserted through the contact holes 160 on the mating connector 120, thereby permitting probing of the target board 110. The use of the mating connector 120, however, may result in an undesirable amount of probe tip capacitance and electrical loading effects associated with such capacitance. Specifically, the mating connector 120 generally is a permanent part of the target system, thereby presenting a load on the target board 110 even when the probe 100 is removed.

Thus, a heretofore unaddressed need exists in the industry to address the aforementioned deficiencies and inadequacies.

SUMMARY

Briefly described, in architecture, one embodiment of a probe comprises a support attached to a probing end of the probe. A spring pin and an isolation network are attached to the support. The support permits probing without the use of a mating connector.

The present disclosure also provides methods for probing a circuit board or a bus.

In this regard, one embodiment of the method comprises the steps of providing a support at a probing end of a probe, and probing test points on a target board without the use of a mating connector. In one embodiment, spring pins are securely attached to the support, thereby permitting direct contact between the spring pins and a target board.

Other probes, methods, features, and advantages will be or become apparent to one with skill in the art upon examination of the following drawings and detailed description. It is intended that all such additional systems, methods, features, and advantages be included within this description.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENTS

Reference is now made in detail to the description of the embodiments as illustrated in the drawings. While several embodiments are described in connection with these drawings, there is no intent to limit the invention to the embodiment or embodiments disclosed herein. On the contrary, the intent is to cover all alternatives, modifications, and equivalents.

Figure 2:
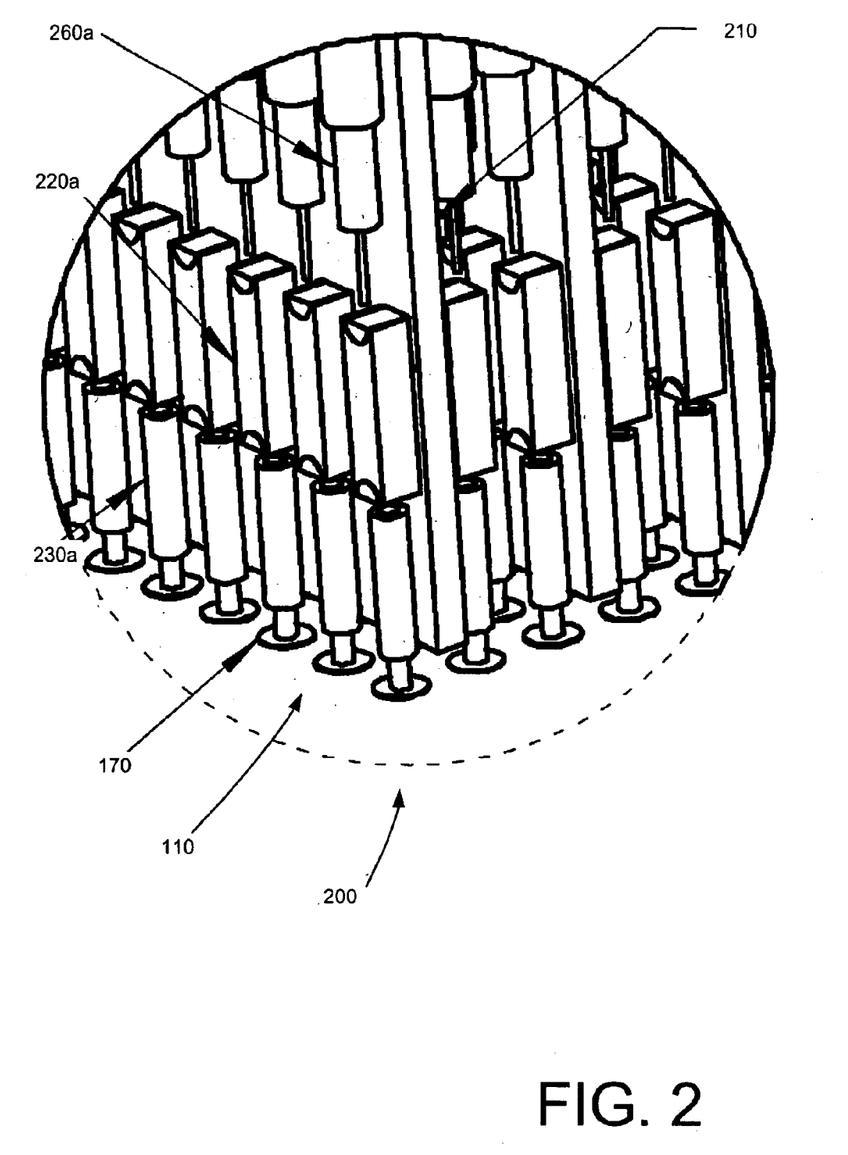
FIG. 2 is a schematic diagram showing spring pins fastened to a support in accordance with one embodiment of the invention.

FIG. 2 is a schematic diagram showing an embodiment of a probe 200 constructed in accordance with the invention. The probe 200 includes a spring pin 230a securely attached to a support 210. Specifically, FIG. 2 shows test points 170 on a target board 110 being probed by a probe 200. As shown in FIG. 2, the support 210, which has an electrically-conductive trace path (not shown in FIG. 2), is attached to a probing end of a probe 200 in such a manner that the support 210 is substantially perpendicular to the target board 110 during probing of test points 170 on the target board 110. In one embodiment, the electrically-conductive trace path (not shown in FIG. 2) is configured to electrically couple the various components on the support. The electrical coupling of the various components is described in greater detail with reference to FIG. 3B. Also, it should be understood that, while multiple pins are securely attached to the support 210 in an example embodiment, only a single pin 230a will be described for purposes of clarity.

A spring pin 230a is securely attached to the support 210 so that the spring pin 230a engages one of the test points 170 in a substantially perpendicular manner during probing of the target board 110. In an example embodiment, the support 210 is a printed circuit board, and the spring pin 230a is securely attached to the printed circuit board by soldering the spring pin 230a to the printed circuit board. In another embodiment, the spring pin 230a may be securely attached to the support 210 by an adhesive or other comparable securing mechanism.

In addition to the spring pin 230a, an isolation network 220a is securely attached to the support 210 to provide impedance matching or equivalent load matching, thereby reducing the electrical intrusiveness of the probe 200 on the target board 110. In one embodiment, the isolation network 220a may be a resistor-capacitor (RC) circuit. The secure attachment of the isolation network 220a to the support 210 results in the isolation network 220a and the spring pin 230a being electrically coupled. In other words, the spring pin 230a is configured to be interposed between the isolation network 220a and the test points 170 during probing of the target board 110. The electrical coupling of the isolation network 220a to the spring pin 230a is described in greater detail with reference to FIG. 3B. Since isolation networks such as, for example, RC circuits are well known in the art, further discussion of isolation networks is omitted here. However, it should be appreciated that, by securely attaching the isolation network 220a and the spring pin 230a to the support 210 as shown in FIG. 2, a connector-less probe (i.e., a probe that does not use a mating connector) is created. In other words, the target board 110 may be probed without using a mating connector 120, thereby decreasing the disadvantages associated with the use of mating connectors.

The isolation network 220a is electrically coupled to an electrical path such as, for example, a coaxial cable 260a through the electrically-conductive trace path (not shown). The coaxial cables 260 are configured to convey signals from the target board 110 to a logic analyzer (not shown), an oscilloscope (not shown), or other test equipment (not shown). While an example embodiment shows coaxial cables 260 providing the electrical path to the test equipment (not shown), it should be understood that the electrical path may be established by circuit traces, electrical wires, or other known mechanisms.

Figure 3A:
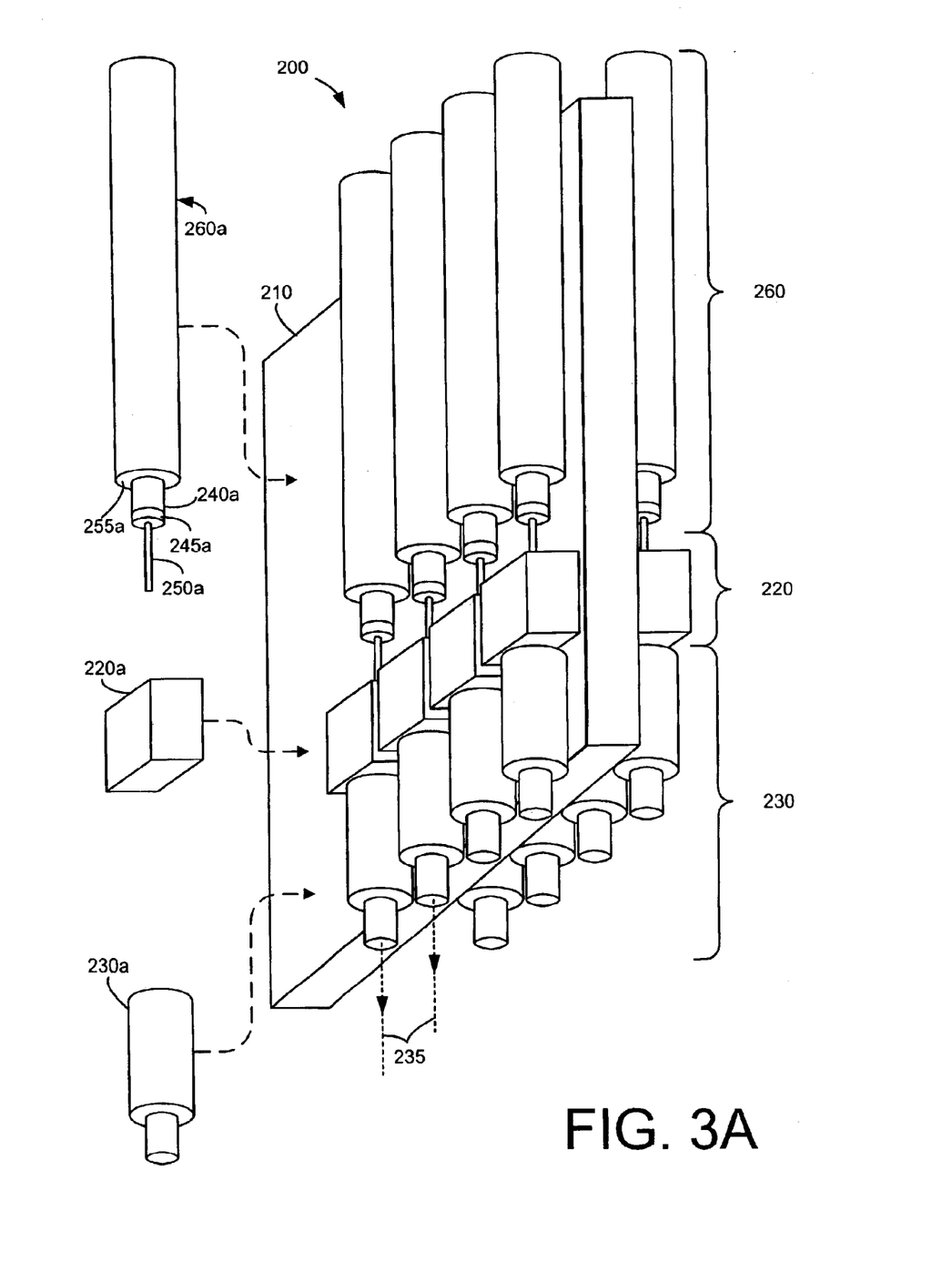
FIG. 3A is a detailed schematic diagram showing the spring pins, isolation network, and support of FIG. 2.

FIG. 3A is a schematic diagram showing the spring pins 230, isolation networks 220, and support 210 of FIG. 2 in greater detail. The spring pins 230 are attached to the support 210 so that the major axis 230 of each of the spring pins 230 is substantially parallel to the major axis 230 of each of the other spring pins 230. The spring pins 230 are configured to engage test points 170 (FIG. 2) on a target board 110 during probing of the target board 110. In this regard, the spring pins 230 are attached to the support 210 such that the major axis 230 of each of the spring pins 230 is substantially parallel to the plane of the support 210.

Similarly, an isolation network 220a is attached to the support 210 so that the isolation network 220a is electrically coupled to the spring pin 230a. In one embodiment, the isolation network 220a and the spring pin 230a may be directly connected so that the resistance of the signal path between the isolation network 220a and the spring pin 230a is minimized. In another embodiment, the isolation network 220a and the spring pin 230a may be electrically coupled via electrically-conductive trace paths on the support 210. The configuration of the isolation network 220a and the spring pin 230a is such that the spring pin 230a is configured to be located between the isolation network 220a and the corresponding test point 170 during probing of the target board 110.

Coaxial cable 260a may also be securely affixed to the support 210, thereby minimizing movement of the coaxial cable 260a. In an example embodiment, the coaxial cable 260a may be a shielded coaxial cable having an inner conductor 250a and a shielded ground 240a separated by an inner dielectric layer 245a, which are all encased in a cable jacket 255a. The inner conductor 250a is configured to relay measured signals to a logic analyzer (not shown), an oscilloscope (not shown), or other test equipment (not shown).

As shown in FIG. 3A, the configuration of spring pins 230 on the support 210 provides easy access to test points 170 (e.g., exposed pads, traces on buses, etc.). Additionally, since the spring pins 230 are configured to engage the test points 170 in a substantially perpendicular manner, the interface between the target board 110 and the probe 200 becomes minimally intrusive, both mechanically and electrically. For example, the perpendicular engagement of the spring pins 230 with the target board 110 provides a minimal cross-sectional area as seen from the target board 110, which, in turn, minimizes the mechanical intrusiveness of the probe 200. Consequently, the minimal cross-sectional area also results in reduced electrical coupling between the probe 200 and the target board 110, thereby minimizing the electrical intrusiveness of the probe 200.

In an example embodiment, the isolation networks 220 are located adjacent to the spring pins 230 and are, therefore, located in close proximity to the test points 170. The close proximity of the isolation networks 220 to the test points 170 reduces the path of the signal between the test points 170 and the isolation network 220, thereby providing greater electrical isolation between the test points 170 and the probe 200. The increased electrical isolation reduces any potential disturbance the probe 200 may have on the target board 110.

Figure 4:
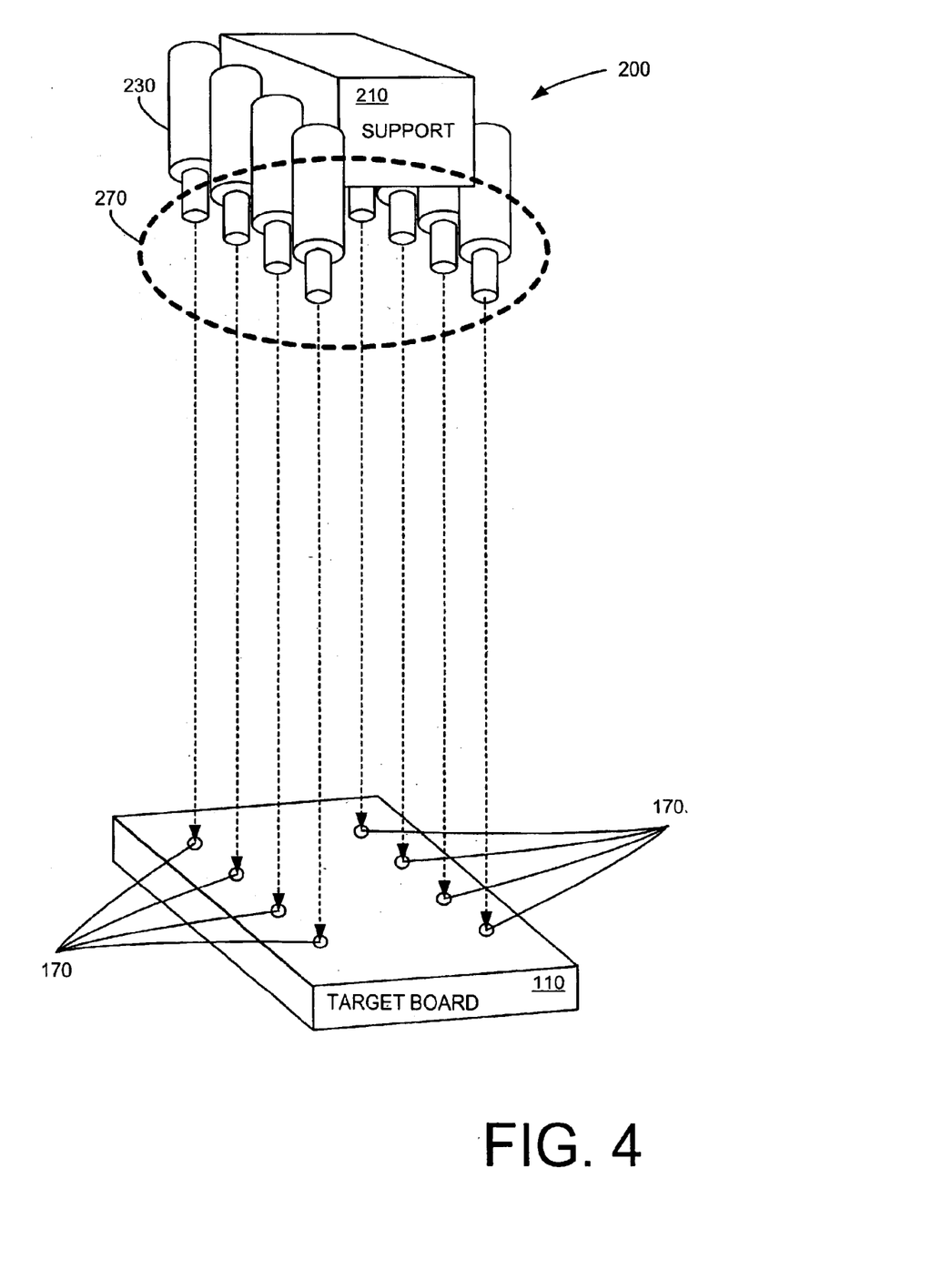
FIG. 4 is a schematic diagram showing a footprint of the spring pins in accordance with one embodiment of the invention.
Figure 5:
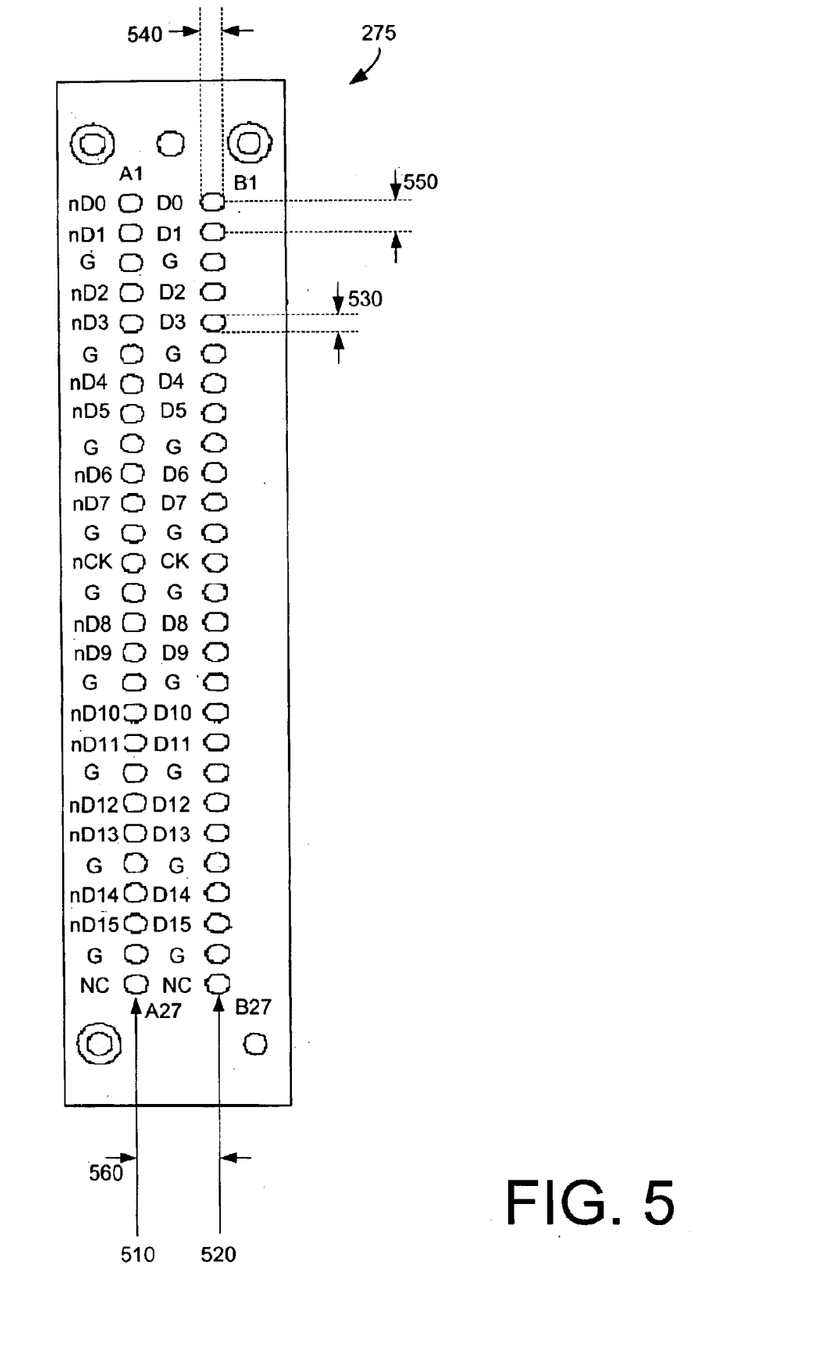
FIG. 5 is a schematic diagram showing a specifically configured footprint in accordance with one embodiment of the invention.

The reduced path between the test points 170 and the isolation networks 220 also reduces any parasitic capacitances that may exist between the isolation networks 220 and the test points 170. The reduced parasitic capacitances reduces noise levels, which results in an improved signal-to-noise ratio (SNR). Moreover, since each of the spring pins 230 may be individually secured to the support 210, flexibility in the spacing of the spring pins 230 is provided to accommodate various circuit layouts. This, in turn, provides flexibility in defining a footprint of the spring pins 230. Similarly, the dimensions of the support 210 may be varied, thereby providing further flexibility in defining the footprint of the spring pins 230. Also, since many different spring pin tip designs are available, the surface area that engages the test points 170 may be further defined by appropriately selecting spring pin tip designs. FIGS. 4 and 5 discuss, in greater detail, footprints defined by the spring pins 230.

Figure 3B:
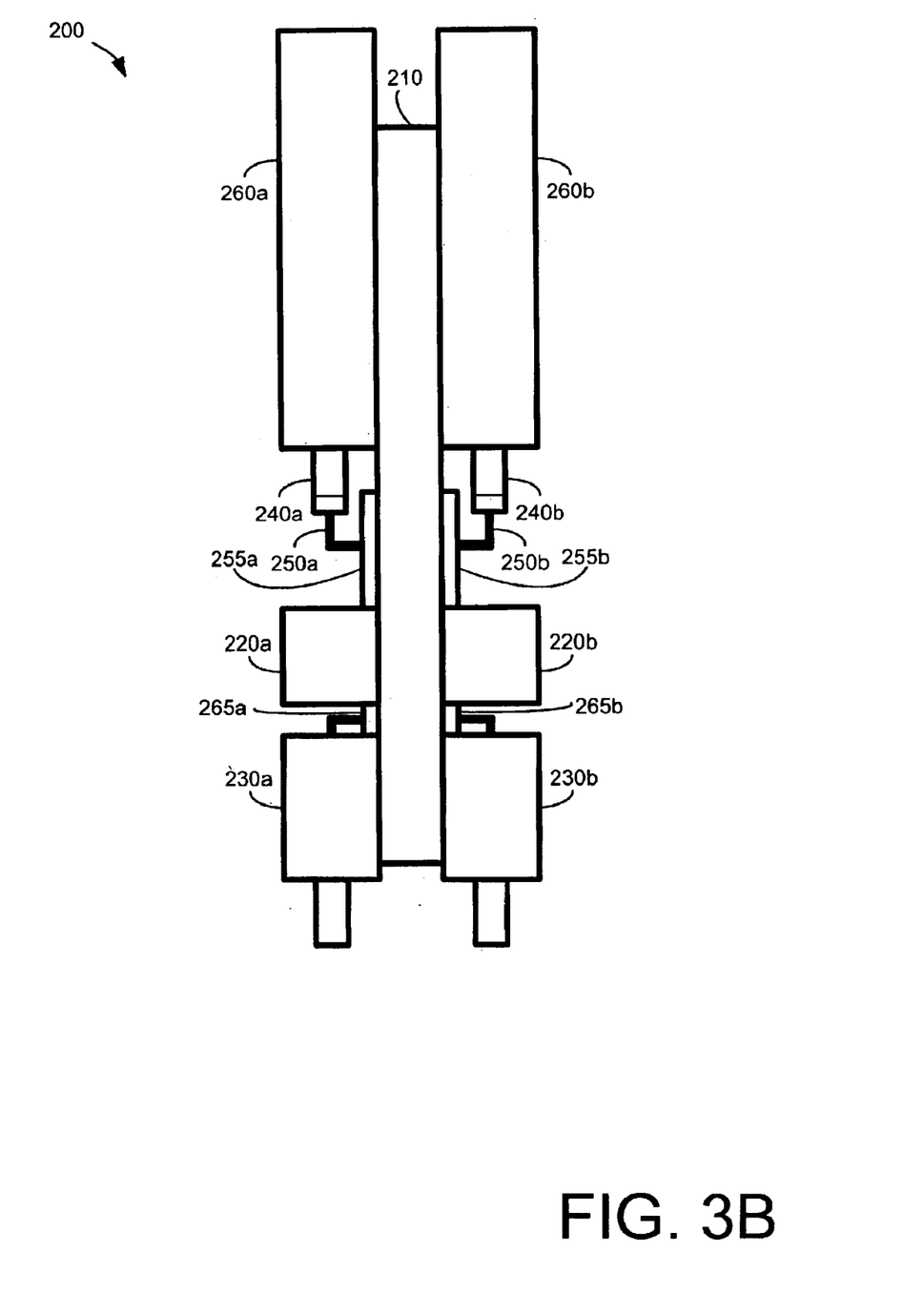
FIG. 3B is a side view of the spring pins, isolation network, and support in accordance with one embodiment of the invention.

FIG. 3B is a side view of the probe 200 illustrating the spring pins 230, isolation networks 220, and support 210 in accordance with one embodiment of the invention. The support 210 comprises electrically-conductive trace paths 255*a*, 255*b*, 265*a*, 265*b* on both sides of the support 210. In this regard, upon securely attaching the spring pins 230*a*, 230*b* to the support 210, each of the spring pins 230*a*, 230*b* is connected to an electrically-conductive trace path 265*a*, 265*b*. Similarly, the isolation networks 220*a*, 220*b* are securely attached to the support 210 such that an electrical connection is established between the isolation networks 220*a*, 220*b* and the electrically-conductive trace paths 255*a*, 255*b*, 265*a*, 265*b*. In this regard, the spring pins 230*a*, 230*b* are electrically coupled to the isolation networks 220*a*, 220*b* through the electrically-conductive trace paths 265*a*, 265*b*.

In addition to the isolation networks 220*a*, 220*b* and the spring pins 230*a*, 230*b*, coaxial cables 260*a*, 260*b* are securely attached to the support 210 by, for example, an adhesive. The inner conductor 250*a*, 250*b* of each of the coaxial cables 260*a*, 260*b* is attached to the electrically-conductive trace paths 255*a*, 255*b*, thereby establishing an electrical connection between the inner conductors 250*a*, 250*b* of the coaxial cables 260*a*, 260*b* and the isolation network 220*a*, 220*b*.

The electrically-conductive trace paths 255*a*, 255*b*, 265*a*, 265*b* electrically couple the spring pins 230*a*, 230*b*, the isolation network 220*a*, 220*b*, and the coaxial cables 260*a*, 260*b*, thereby permitting signal conduction from the target board 110 and any test equipment (not shown) that may be connected to the cables 260*a*, 260*b*.

While FIG. 3B shows the various components attached to both sides of the support 210, it should be understood that the various components may be attached to only one side of the support 210, thereby providing a single, linear footprint of spring pins 230.

FIG. 4 is a schematic diagram of a probe 200 showing a footprint 270 of the spring pins 230 in accordance with one embodiment of the invention. As shown in FIG. 4, a target board 110 has a number of test points 170, which are arranged in a specific configuration. Specifically, FIG. 4 shows eight test points 170 arranged in two parallel columns, each column having four collinear test points 170. For this type of configuration, if the distance between the two parallel columns and the separation between each of the linear test points 170 is known, then a footprint 270 corresponding to the test points' 170 may be created by appropriately configuring the spring pins 230. In other words, if the distance between the two parallel columns is known, then a support 216 having a width that is approximately equal to the distance between the two parallel columns may be selected to define one dimension of the footprint 270. Similarly, the spring pins 230 may be separated from each other by approximately the same distance as the linear test points 170, thereby defining the other dimension of the footprint 270. As shown from FIG. 4, the design of the footprint 270 is scalable and may be fabricated in modular form, thereby providing greater flexibility in design.

FIG. 5 is a schematic diagram showing a specifically configured footprint 275 in accordance with one embodiment of the invention. As shown in FIG. 5, one embodiment of the footprint 270 comprises two substantially parallel columns 510, 520 of contact points. In the embodiment of FIG. 5, the contact points are arranged in a collinear fashion to be substantially equidistant from each other. In an example embodiment, the separation between adjacent collinear contact points is approximately 0.04 inches. Each of the two substantially parallel columns 510, 520 in FIG. 5 has twenty-seven contact points, thereby resulting in fifty-four total contact points. Additionally, in the embodiment of FIG. 5, the two substantially parallel columns 510, 520 are separated from each other by a distance ranging from approximately 0.072 inches to approximately 0.128 inches. In an example embodiment, the two substantially parallel columns 510, 520 are separated from each other by a distance of approximately 0.1 inches.

As discussed with reference to FIG. 3, since many different spring pin tip designs are available, the shape of the contacts may further be defined by appropriate selection of spring pin tip designs. In the embodiment of FIG. 5, spring tips are selected such that each spring tip has a substantially elliptical shape with a major axis of approximately 0.028 inches and a minor axis of approximately 0.023 inches.

While a connector-less probe (i.e., a probe that does not use a mating connector 120) is described with reference to FIGS. 1 through 5, other embodiments of the invention may be seen as a method for probing a board or a bus without using a mating connector. Several embodiments of the method are shown in FIGS. 6 through 7.

Figure 6:
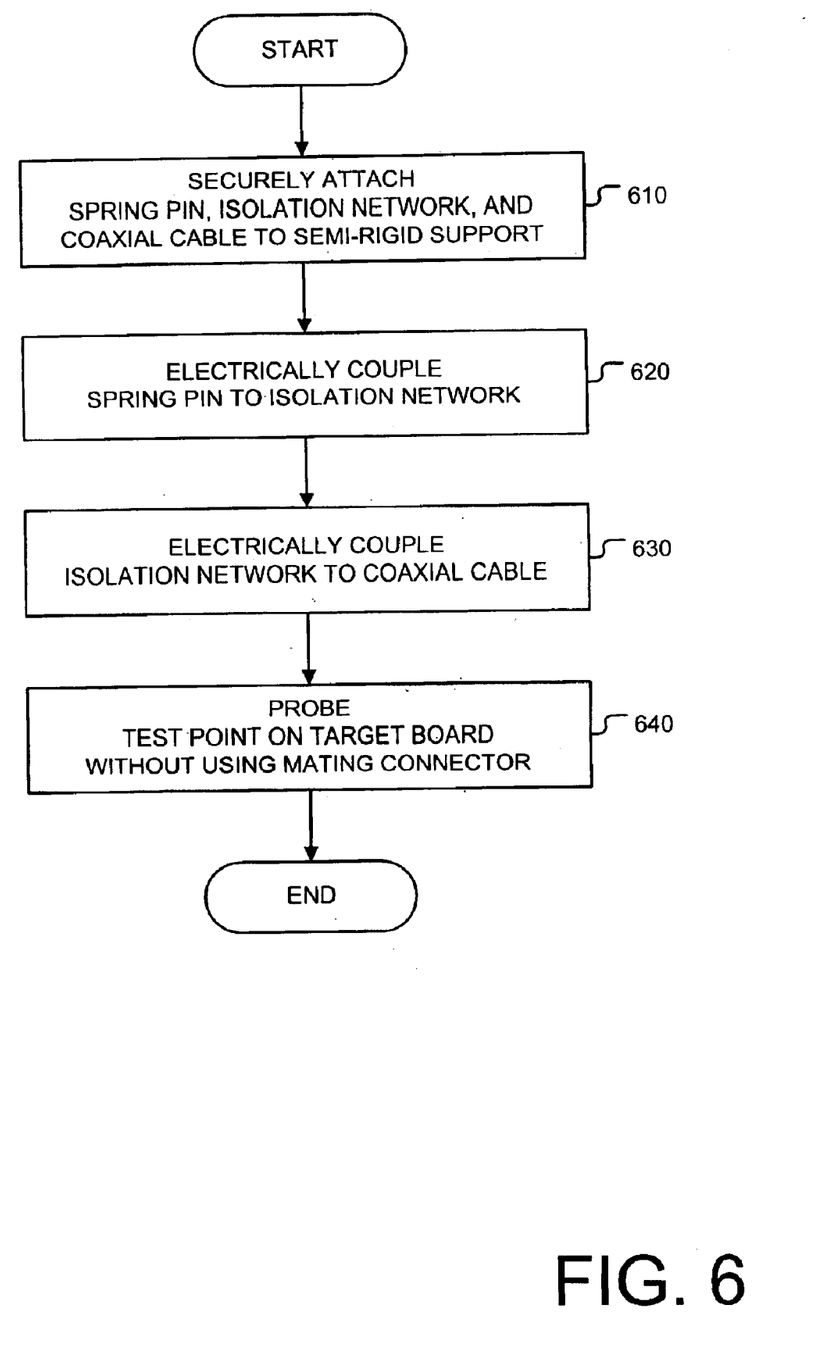
FIG. 6 is a flowchart showing one embodiment of a method for probing a board or bus without using a mating connector.

As shown in FIG. 6, one embodiment of the method comprises the step of securely attaching (610) a spring pin 230, an isolation network 220, and a coaxial cable 260 to a support 210. The spring pin 230 and the isolation network 220 are securely attached (610) to the support 210 so that the spring pin 230 is electrically coupled (620) to the isolation network 220. Similarly, the isolation network 220 and the coaxial cable 260 are securely attached (610) to the support 210 so that the isolation network 220 is electrically coupled (630) to the coaxial cable 260. Thus, upon connecting the various components 220, 230, 260 to the support, an electrical path is provided between a target board 110 and test equipment (not shown) during probing of the target board 110. In this regard, the method may be seen as further comprising the step of probing (640) test points 170 on a target board 110 without using a mating connector 120.

Figure 7:
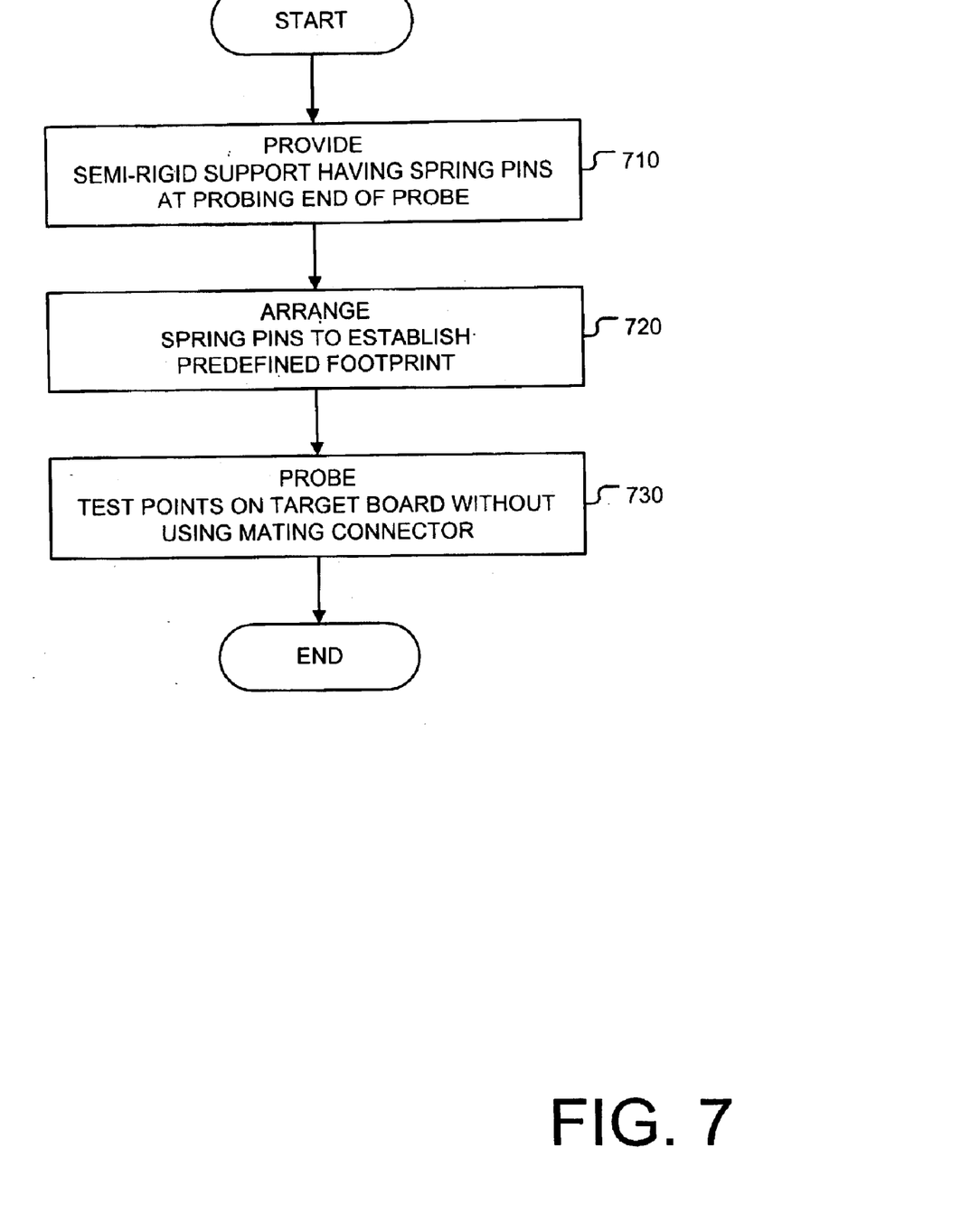
FIG. 7 is a flowchart showing another embodiment of a method for probing a board or bus without using a mating connector.

As shown in FIG. 7, another embodiment of the method comprises the step of providing (710) a support 210 at a probing end of a probe 200. In one embodiment, the support 210 has spring pins 230 that are configured to engage test points 170 on a target board 110. The spring pins 230 are arranged (720) on the support 210 to establish a predefined footprint 270. Upon providing (710) the support 210 and arranging (720) the spring pins 230 in a predefined footprint 270, test points 170 on the target board 110 are probed (730) without using a mating connector 120.

In an example embodiment, the providing (710) of the support 210 at the probing end of the probe 200 comprises the step of connecting an isolation network 220 to the spring pins 230 so that the spring pins 230 are interposed between the isolation network 220 and the test points 170 during probing of the test points 170. As discussed with reference to FIGS. 2 and 3, the spring pins 230 and the isolation network 220 may be connected to the support 210 so that the spring pins 230 and the isolation network 220 are substantially parallel to the support 210.

Although exemplary embodiments have been shown and described, it will be clear to those of ordinary skill in the art that a number of changes, modifications, or alterations may be made, none of which depart from the spirit of the present invention. For example, while FIGS. 2 and 3 show a plurality of spring pins attached to a support to provide a multiple-tip probe, it should be understood that a single spring pin may be attached to the support to provide a single-tip probe, which may be used, for example, to probe signals using an oscilloscope. Additionally, while a specific footprint is shown with reference to FIG. 5, it should be understood that the footprint may be varied according to the configuration of test points on various target boards. Also, while the embodiments of FIGS. 2 through 7 show the spring pins and isolation network being securely attached to the support by soldering, it should be appreciated that the spring pins and isolation network may be securely attached to the support by adhesives or other known mechanisms. All such changes, modifications, and alterations should therefore be seen as within the scope of the present invention.

What is claimed is:

1. A probe for probing test points on a target board, the probe comprising:
    a probe-tip board attached to a probing end of the probe, the probe-tip board arranged substantially perpendicular to the target board during probing of the test points on the target board;
    spring pins being securely attached to the probe-tip board so that the spring pins are substantially parallel to the probe-tip board, each of the spring pins adapted to engage a corresponding test point in the absence of a mating connector, the spring pins being substantially perpendicular to the target board when each of the spring pins engages the corresponding test point; and
    isolation networks securely attached to the probe-tip board, the isolation networks electrically coupled to the spring pins so that the spring pins interpose the isolation networks and the target board during probing of the test points on the target board.

2. The probe of claim 1, wherein the probe-tip board comprises electrically-conductive trace paths.

3. The probe of claim 2, wherein the isolation network is electrically coupled to the spring pins through the electrically-conductive trace paths.

4. The probe of claim 1, further comprising additional probe-tip boards configured to be substantially perpendicular to the target board during probing of the test points on the target board.

5. A probe comprising:
    a support attached to a probing end of the probe, the support arranged substantially perpendicular to a target board during probing of a test point on the target board;
    a spring pin adapted to engage the test point on the target board in the absence of a mating connector, the spring pin arranged substantially perpendicular to the target board when the spring pin engages the test point on the target board, the spring pin being securely attached to the support so that the spring pin is substantially parallel to the support; and
    an isolation network electrically coupled to the spring pin so that the spring pin is located between the isolation network and the test point during probing of the test point, the isolation network securely attached to the support.

6. The system of claim 5, wherein the probe is configured to probe a digital circuit.

7. The system of claim 5, wherein the isolation network is directly connected to the spring pin.

8. The system of claim 5, wherein the support is a printed circuit board having electrically-conductive trace paths.

9. The system of claim 8, wherein the isolation network is electrically coupled to the spring pins through the electrically-conductive trace paths on the printed circuit board.

10. The system of claim 5, further comprising additional spring pins adapted to engage additional test points on the target board, the additional spring pins adapted to be substantially perpendicular to the target board when the additional spring pins engage the additional test points on the target board, the additional spring pins being securely attached to the support so that the additional spring pins are substantially parallel to the support.

11. The system of claim 10, wherein the additional spring pins are electrically coupled to the isolation network so that the additional spring pins are interposed between the isolation network and the additional test points during probing of the additional test points.

12. The system of claim 10, wherein the spring pin and the additional spring pins are configured to establish a predefined footprint of contact points.

13. The system of claim 12, wherein each contact point is substantially elliptical in shape.

14. The system of claim 13, wherein the major axis of the substantially elliptical shape is approximately 0.028 inches.

15. The system of claim 13, wherein the minor axis of the substantially elliptical shape is approximately 0.023 inches.

16. The system of claim 12, wherein the predefined footprint of contact points comprises two substantially parallel columns of contact points.

17. The system of claim 16, wherein the contact points are arranged substantially equidistant from adjacent contact points in each of the two substantially parallel columns of contact points.

18. The system of claim 17, wherein the contact points are separated by approximately 0.04 inches from adjacent contact points in each of the two substantially parallel columns of contact points.

19. The system of claim 16, wherein each of the two substantially parallel columns of contact points has twenty-seven contact points.

20. The system of claim 16, wherein the two substantially parallel columns of contact points are separated from each other by approximately 0.1 inches.

21. The system of claim 16, wherein the two substantially parallel columns of contact points are separated from each other by approximately 0.072 inches.

22. The system of claim 16, wherein the two substantially parallel columns of contact points are separated from each other by approximately 0.128 inches.

23. A method for probing digital signals comprising:
    securely attaching a spring pin to a support so that the spring pin is substantially parallel to the support, the spring pin being configured to engage a target board in the absence of a mating connector;
    securely attaching an isolation network to the support so that the isolation network is substantially parallel to the support;
    securely attaching an electrical path to the support;
    electrically coupling the spring pin to the isolation network; and
    electrically coupling the isolation network to the electrical path.

24. The method of claim 23, further comprising:
    probing a test point on a target board in the absence of a mating connector.

25. The method of claim 24, wherein the probing the test point on the target board comprises:

detecting signals from the test point on the target board.

26. The method of claim 24, wherein the probing the test point on the target board comprises:

detecting signals from test points on a digital circuit.

27. The method of claim 23, wherein the electrically coupling the spring pin to the isolation network comprises:

connecting the spring pin to an electrically-conductive trace path on the support; and connecting the isolation network to the electrically-conductive trace path on the support.

28. The method of claim 23, wherein the electrically coupling the spring pin to the isolation network comprises:

directly connecting the spring pin to the isolation network.

29. The method of claim 23, wherein the electrically coupling the isolation network to the electrical path comprises:

connecting the isolation network to an electrically-conductive trace path on the support; and connecting a coaxial cable to the electrically-conductive trace path on the support.

30. The method of claim 23, wherein the electrically coupling the isolation network to the electrical path comprises:

directly connecting the isolation network to a coaxial cable.

31. A method comprising:

providing a support at a probing end of a probe, the support having spring pins, the spring pins configured to engage test points on a target board in the absence of a mating connector;

electrically coupling an isolation network to the spring pins so that the spring pins are interposed between the isolation network and test points during probing of the test points; and probing the test points on the target board.

32. The method of claim 31, wherein the electrically coupling the isolation network to the spring pins comprises:

connecting the isolation network to the support so that the isolation network and the spring pins are substantially parallel to the support.

33. The method of claim 31, further comprising: arranging the spring pins to establish a predefined footprint.

* * * * *